United States Patent
Yoshitake

(10) Patent No.: US 8,718,972 B2
(45) Date of Patent: May 6, 2014

(54) ELECTRON BEAM WRITING APPARATUS AND POSITION DISPLACEMENT AMOUNT CORRECTING METHOD

(75) Inventor: Shusuke Yoshitake, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 504 days.

(21) Appl. No.: 12/419,642

(22) Filed: Apr. 7, 2009

(65) Prior Publication Data

US 2009/0259431 A1 Oct. 15, 2009

(30) Foreign Application Priority Data

Apr. 9, 2008 (JP) ................................. 2008-100951

(51) Int. Cl.
*G01C 9/00* (2006.01)
*G01J 1/00* (2006.01)

(52) U.S. Cl.
USPC .............. 702/150; 702/94; 356/600; 356/601

(58) Field of Classification Search
USPC ............. 702/150; 250/491.1–492.3; 356/601; 3/150
See application file for complete search history.

(56) References Cited

U.S. PATENT DOCUMENTS

| 5,675,471 | A | * | 10/1997 | Kotecki | 361/234 |
| 5,903,428 | A | * | 5/1999 | Grimard et al. | 361/234 |
| 6,317,647 | B1 | * | 11/2001 | Akaike et al. | 700/213 |
| 2001/0036749 | A1 | * | 11/2001 | Levert et al. | 438/758 |
| 2004/0233404 | A1 | * | 11/2004 | Hayashi | 355/53 |
| 2006/0126038 | A1 | * | 6/2006 | Hoogendam et al. | 355/52 |
| 2007/0103659 | A1 | * | 5/2007 | Yoshitake et al. | 355/53 |

FOREIGN PATENT DOCUMENTS

| JP | 7-29814 | 1/1995 |
| JP | 8-250394 | 9/1996 |
| JP | 2004-214415 | 7/2004 |
| JP | 2007-150286 | 6/2007 |

OTHER PUBLICATIONS

Kalkowski et al., Flatness characterization of EUV mask chucks, 2007, Elsevier B.V., pp. 737-740.*
Nataraju, Analysis of the mechanical response of extreme ultraviolet lighography masks during electrostatic chucking, 2007, pp. 1-130.*
Natsu et al., Effects of support method and mechanical property of 300 mm silicon wafer on sori measurements, 2004, Elsevier Inc, pp. 19-26.*
Office Action Mailed Oct. 2, 2012, in Japanese Patent Application No. 2008-100951 filed Apr. 9, 2008 (with English Translation).

* cited by examiner

*Primary Examiner* — Janet Suglo
*Assistant Examiner* — Michael Dalbo
(74) *Attorney, Agent, or Firm* — Oblon, Spivak, McClelland, Maier & Neustadt, L.L.P.

(57) ABSTRACT

The present invention provides an electron beam writing apparatus and an image placement error correcting method each capable of calculating a high-accuracy correction amount relative to an image placement error in consideration of a difference in required unit area of height distribution data between the shape of a back surface of an EUV mask and the shape of a surface of a pin chuck. Of back surface shape data of the EUV mask necessary to perform an image placement error correction of each pattern, the back surface shape data of a position brought into contact with each pin of the pin chuck is extracted. The image placement error is calculated only from the extracted back surface shape data.

7 Claims, 3 Drawing Sheets

ELECTRON BEAM WRITING APPARATUS AND POSITION DISPLACEMENT AMOUNT CORRECTING METHOD

CROSS-REFERENCE TO RELATED APPLICATION

The present application claims priority under 35 U.S.C. §119 to Japanese patent application number 2008-100951, filed Apr. 9, 2006.

BACKGROUND OF THE INVENTION

1. Field of the Invention

The present invention relates to an electron beam writing apparatus equipped with means for correcting an image placement error to write each pattern and an image placement error correcting method thereof, and particularly to an electron beam writing apparatus and an image placement error correcting method using an EUV mask.

2. Background Art

EUV lithography is now cited as a lithography technique useful as an alternative to photolithography. Since a reflection type mask (hereinafter called "EUV mask") is used in the EUV lithography, an electrostatic chuck for holding a mask from its back surface is used.

While the flatness of a reflective surface of a substrate, i.e., its surface exerts a direct influence on the accuracy of position of each pattern in the EUV mask, it is important to consider the relationship between the shape of the back surface of the EUV mask and the chuck surface (front face) of the electrostatic chuck for the purpose of maintaining satisfactory flatness of such a surface. This is because when foreign substances such as particles are intruded between the back surface of the EUV mask and the surface of the electrostatic chuck, the satisfactory flatness of the EUV mask surface is inhibited due to the fact that the electrostatic chuck is not brought into close contact with the EUV mask locally at its intruded location. This is also because each pattern written onto the surface on a consequential basis is distorted with deformation of the surface shape by correction of the back surface shape of the EUV mask by the electrostatic chuck.

Therefore, there has been a need to correct the image placement error of the pattern for the purpose of improving image placement accuracy of the EUV mask held by the electrostatic chuck. With the foregoing in view, it has heretofore been practiced to measure the back surface shape of the EUV mask by an optical measuring apparatus, bring back surface shape data obtained by this measurement and back shape data corrected by the electrostatic chuck to approximations using tertiary or more polynomial expressions respectively and determine a correction amount relative to the image placement error from the resultant approximate expressions (refer to, for example, a patent document 1).

Meanwhile, a pin chuck is used as the electrostatic chuck to reduce an influence exerted on the flatness due to the intrusion of the foreign substances or the like between the back surface of the EUV mask and the surface of the electrostatic chuck upon its chuck.

Since the back surface shape data of the EUV mask measured by the optical measuring apparatus has the smaller pixel size than the pitch of the pin chuck, the shape of a back surface of a position brought into no contact with each pin is also measured between the pitch of the pin chuck where the EUV mask is held by the pin chuck from its back surface.

FIG. 3 is a partly enlarged view of an EUV mask held by a pin chuck. FIG. 3 shows a state in which when the EUV mask M is held by the pin chuck C from its back surface where a protruded shape i exists in the back surface of the EUV mask, the protruded shape i intrudes into the pitch of the pin chuck C between pins p1 and p2 thereof adjacent to each other without making contact with both of the pins p1 and p2.

There was influenced that when a correction amount relative to an image placement error was determined using the above polynomial expressions with respect to the measured back surface shape data and the corrected back surface data as in the related art where such a state as shown in FIG. 3 has occurred, an error occurred due to the difference in resolution, so that an accurate correction amount could not be obtained, thus resulting in degradation of image placement accuracy.

Incidentally, the shape and pitch of the pin chuck are not defined in terms of standards unified under the SEMI standard. There is a possibility that they will differ, for every EUV scanner or for every customer who takes its delivery.

With the foregoing problems in view, the present invention therefore aims to provide an image placement error correcting method capable of calculating a high-accuracy correction amount relative to an image placement error in consideration of a difference in resolution between the shape of a back surface of an EUV mask and the shape of a surface of a pin chuck, and an electron beam writing apparatus equipped with image placement error correcting means.

[Patent Document 1] Japanese Patent Application Laid-Open No.

SUMMARY OF THE INVENTION

According to one aspect of the present invention, an electron beam writing apparatus has means for correcting an image placement error taking into consideration a back surface shape of an EUV mask and a surface shape of a pin chuck brought into contact with the back surface of the EUV mask to hold the EUV mask. The electron beam writing apparatus comprises flatness measuring means for measuring the back surface shape inherent in the EUV mask, EUV mask backsurface shape data memorizing means for memorizing data about the back surface shape of EUV mask measured by flatness measuring means, and means for memorizing surface shape data about the pin chuck, comprising at least shape data about pins of the pin chuck specified by a relationship with center coordinates of the EUV mask, pitch data between the pins, and chucked region data. The image placement error correcting means includes means for reading the back surface shape data of the EUV mask and the surface shape data about the pin chuck to perform an approximate computing process on a back surface shape of the EUV mask to be corrected and extracting back surface shape data of the positions brought into contact with the pins of the pin chuck out of the back surface shape data of the EUV mask, based on the surface shape data about the pin chuck, and corrects the image placement error from the extracted back surface shape data.

According to the present configuration, only the portion brought into contact with the pin chuck is extracted and used as the mask's back surface shape data used in the calculation of the correction amount for the image placement error of each pattern.

In order to make it possible to extract only the portion brought into contact with the pin chuck from the mask's back surface shape data, correct the image placement error of the pattern and determine in advance whether writing should be conducted, means for reading each of inherent identification marks provided in EUV mask blanks may be provided. Further, the back surface shape data memorizing means may memorize the identification marks and the back surface shape data therein in association with each other and may be provided with means for performing an image placement error correction based on the extracted back surface shape data when the corresponding identification mark is read by the reading means and thereby determining whether writing should be conducted.

Since there is a possibility that as described above, the shape and pitch of the pin chuck will differ, for example, for every EUV scanner or for every customer who takes its delivery, the determining means may contain even attribute data about whether the EUV mask blanks read by the reading means are fit for the scanner to be used, as a determining element.

The image placement error correcting means needs to assume a neutral plane in order to specify an image placement error. Since a frictional force occurs at a pin contacting position between the back surface of the EUV mask and the surface of the pin chuck, a force parallel to the surface of the pin chuck acts on the surface of the EUV mask when the mask is held by the pin chuck. If the frictional force is large and the amount of deformation is small at this time, then the EUV mask is elastically deformed at the position where each pin and the back surface of the EUV mask are brought into contact with each other, so that the force is balanced. Therefore, the neutral plane can be assumed to have a distribution in a plane direction centering around a position where the pin is firstly brought into contact with the back surface of the EUV mask. Thus, the image placement error may be calculated with the neutral plane as a distorted surface represented in a symmetric function system, taking a position where the EUV mask and the pin chuck firstly contact, as center coordinates.

According to another aspect of the present invention, in a method for correcting an image placement error taking into consideration a back surface shape of an EUV mask and a surface shape of a pin chuck brought into contact with the back surface of the EUV mask to hold the EUV mask, surface shape data about the pin chuck, comprising at least shape data about pins of the pin chuck, pitch data between the pins, and chucked region data is memorized. Back surface shape data obtained by measuring the back surface shape of the EUV mask is memorized. The surface shape data about the pin chuck and the back surface shape data of EUV mask are read, and a position brought into contact with the surface shape data, of the back surface shape data is extracted. An approximate computing process is performed using the extracted back surface shape data of EUV mask to thereby calculate an image placement error of the pattern. A correction amount is calculated from the image placement error thereof.

DETAILED DESCRIPTION OF THE EMBODIMENTS

Figure 1:
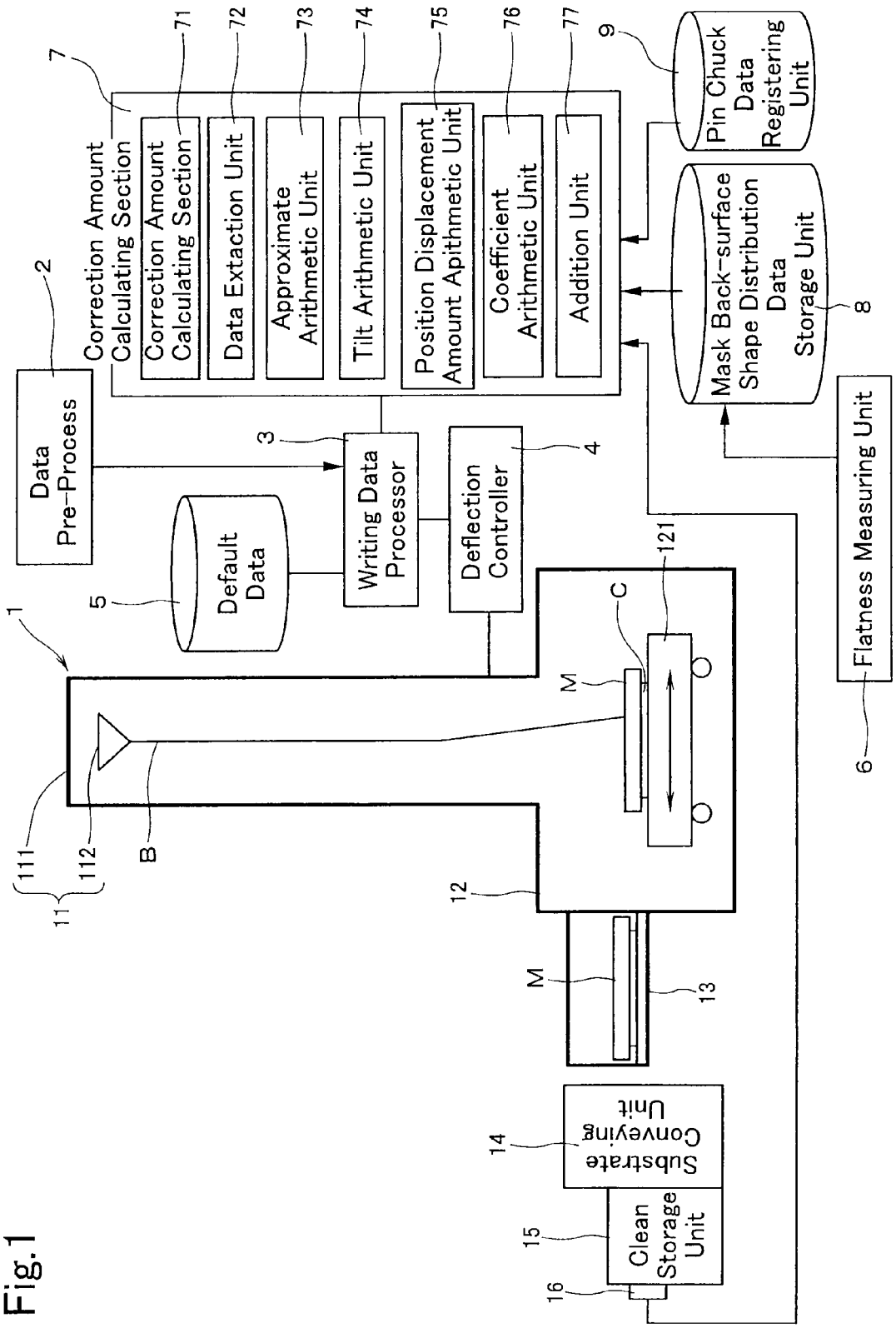
FIG. 1 is a schematic view showing a configuration of an electron beam writing apparatus according to the present invention.

Referring to FIG. 1, designated at numeral 1 is a main body of an electron beam writing apparatus. The electron beam writing apparatus 1 comprises an electronic optical system 11 and a writing chamber 12. In the electronic optical system 11, an electron gun 112 and unillustrated various deflection systems and various lenses are installed in an electronic optical barrel 111. An electron beam B emitted from the electron gun 112 to the surface of an EUV mask M lying within the writing chamber 12 is controlled by the various deflection systems and various lenses to write a desired pattern.

The writing chamber 12 is evacuated thereinside by a vacuum pumping system (not shown) so that the EUV mask M held by support points corresponding to three points is placed over a stage 121 freely movable in an XY direction. Incidentally, a laser positioning measurement unit or instrument that performs drive control of the stage 121 and stage position measurements is operated by an unillustrated machine controller.

The positioning of the EUV mask M is performed within an alignment chamber 13 connected to the writing chamber 12 via a gate valve (not shown). The EUV mask M is transferred from a substrate transferring unit 14 to the alignment chamber 13 via its corresponding gate valve (not shown) provided at a position opposite to the gate valve interposed between the alignment chamber 13 and the writing chamber 12. The substrate transferring unit 14 carries mask blanks in from a locally-cleaned clean storage unit 15 such as a SMIF pod.

A writing data processor 3 converts writing data to its corresponding written data, based on data transferred from a data pre-processor 2 and outputs the same to a deflection controller 4. The various deflection systems are controlled by the deflection controller 4 so that the electron beam B can be applied to a desired position according to an applied deflection voltage. Incidentally, the control of the stage 121 with deflection control is conducted via the machine controller.

Upon processing of such deflection systems, the stage is controlled coupled with the amount of correction relative to the image placement error of each pattern as the actual amount of deflection. The correction amount is calculated by allowing the writing data processor 3 to add default data 5 recorded with error components (for example, an image placement error caused by deformation of the EUV mask held by the three points on the stage due to the flexure of its own weight, and a position displacement inherent in a coordinate system, which is contained in the apparatus per se) of image placement accuracy of each pattern as a default value, and correction amount data calculated by a correction amount calculating section 7 to be described later.

Figure 2:
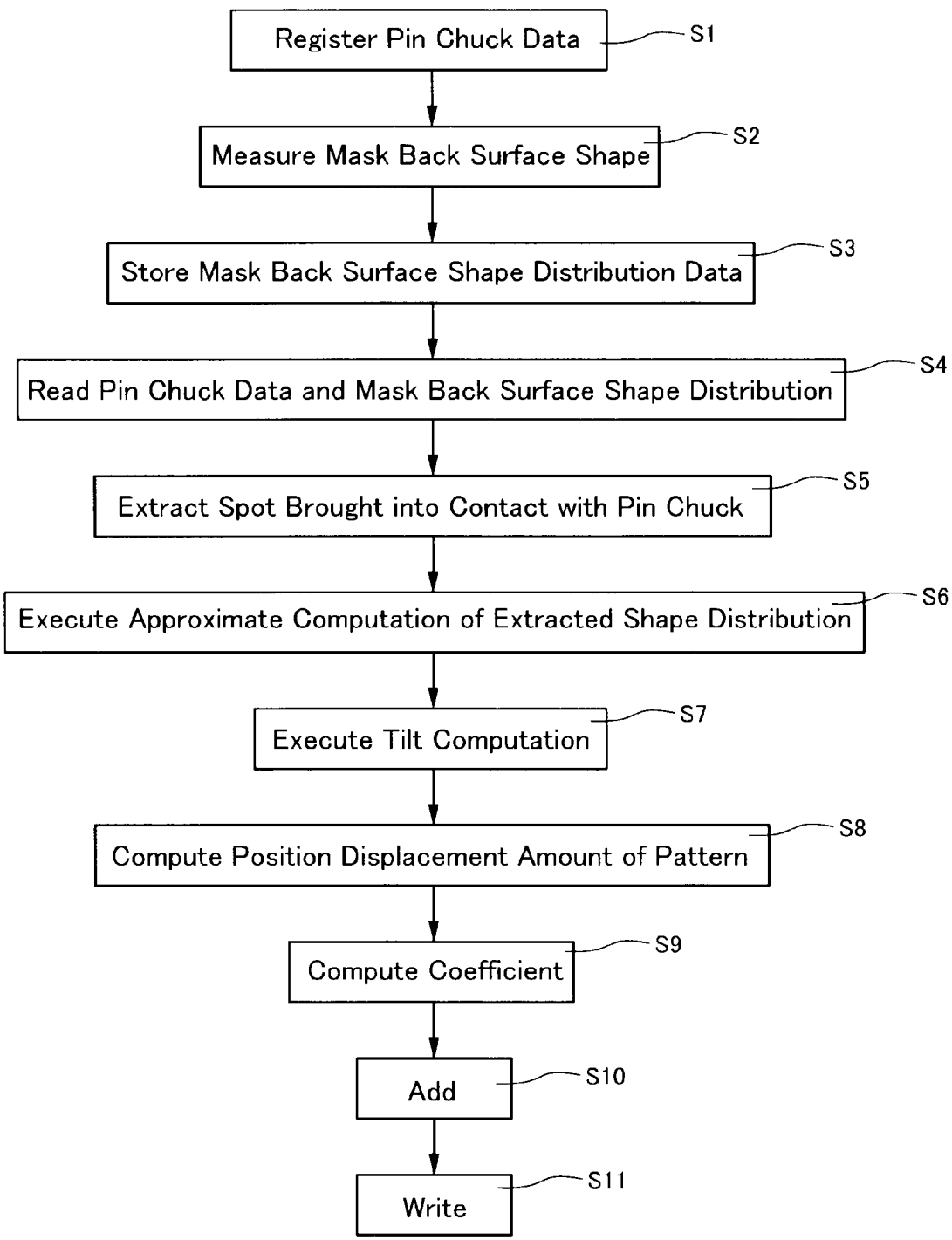
FIG. 2 is a processing flow chart of an image placement error correcting method according to the present invention.
Figure 3:
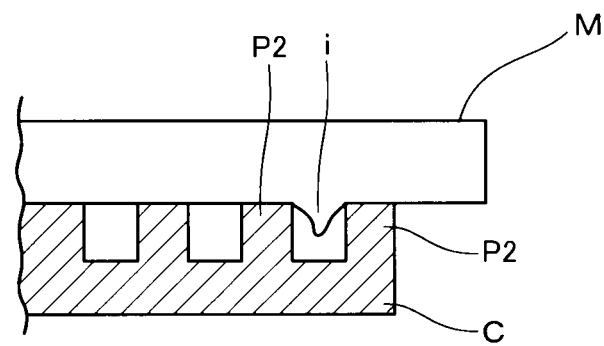
FIG. 3 is a partly enlarged view of an EUV mask held by a pin chuck.

The correction amount calculating section 7 calculates a correction amount relative to the image placement error of each pattern caused when the EUV mask M is held by a pin chuck of a scanner targeted at its use. A processing method of the correction amount calculating section 7 will be explained below with reference to a processing flow of FIG. 2.

Surface shape data about the pin chuck of the scanner targeted at its use is memorized in a pin chuck data memorizing unit 9 in advance (S1). The surface shape data contains at least shape data about pins specified by a relationship with the center coordinates of the EUV mask M, pitch data between the pins, and chucked region data.

A flatness measuring unit 6 measures an inherent back surface shape with respect to the EUV mask M (S2) and accumulates or memorizes it in a mask back-surface shape data memory unit 8 (S3). The back surface shape inherent in the EUV mask indicates one obtained by measuring a three-dimensional shape of its back surface to the exclusion of the influence of its own weight.

The correction amount calculating section 7 reads the respective data from the mask back-surface shape data memory unit 8 and the pin chuck memorizing unit 9 (S4). A data extraction unit 72 compares the two and extracts only data at the positions brought into contact with the pins of the pin chuck of the scanner targeted at its use, out of the mask back-surface shape data (S5).

An approximate arithmetic unit 73 approximates a shape by a polynomial expression, based on the extracted mask back-surface shape data (S6). A tilt arithmetic unit 74 determines a local tilt distribution from the polynomial expression (S7). Based on the tilt distribution, an image placement error arithmetic unit 75 calculates an image placement error at the time that a pattern is written onto the surface of the EUV mask M, in consideration of a distortion amount assumed where the back surface of the EUV mask M is held by the pin chuck of the scanner targeted at its use and thereby brought into flat correction (S8). Incidentally, the processing from the above S6 to S10 shown below has been explained with the known image placement error correction method as an example in the present embodiment.

It is necessary to virtually represent a neutral plane or surface upon the arithmetic operations of the tilt arithmetic unit 74 and the image placement error arithmetic unit 75. In general, the neutral plane is defined as a virtual surface that does not expand and contract even if the mask is deformed. In the case like the flexure of its own weight, which is small in the influence of disturbances, the neutral plane results in the middle between the front surface of the mask and its back surface.

Since, however, a frictional force occurs at a pin contacting position between the back surface of the EUV mask and the surface of the pin chuck, a force parallel to the surface of the pin chuck acts on the surface of the EUV mask when the mask is held by the pin chuck. If the frictional force is large and the amount of deformation is small at this time, then the EUV mask is elastically deformed at the position where each of the pins and the back surface of the EUV mask are brought into contact with each other, so that the force is balanced.

Therefore, the neutral plane can be assumed to have a z-direction distribution in a plane direction centering around a position where each pin is firstly brought into contact with the back surface of the EUV mask. Thus, in the image placement error correcting method according to the present invention, the position of the neutral plane is expressed like $z=f(x, y)$ as a position where the EUV mask and the pin chuck first contact each other, and an image placement error may be calculated based on it.

A coefficient arithmetic unit 76 computes a coefficient of an approximate expression for calculating an image placement error correction amount, based on the image placement error obtained by the above operating process (S9). The image placement error correction amount obtained by applying the coefficient obtained by the result of computation to a polynomial expression indicates the amount of deformation of the EUV mask surface at the time that the EUV mask M is brought to flattening or flat correction by holding the EUV mask M with the pin chuck of the scanner targeted at its use.

Finally, when the back surface of the EUV mask is not flattened, that is when a normal photomask other than the EUV mask is written, an adder or addition unit 77 adds a coefficient parameter related to an image placement error correction amount at the time that each pattern is written onto the surface of the mask, to the coefficient obtained by the coefficient arithmetic unit 76 (S10). The coefficient parameter corresponds to the data memorized in the default data 5, and the correction amount calculating section 7 may read the default data via the writing data processor 3.

The image placement error correction amount obtained at the addition unit 77 is outputted from the writing data processor 3 to the deflection controller 4, where the position to apply the electron beam B is controlled as a deflection voltage to be applied, whereby desired write processing is conducted (S11).

On the other hand, the shape and pitch of the pin chuck of the scanner targeted at its use are not defined in terms of standards unified under the SEMI standard. There is a possibility that they will differ, for example, for every EUV scanner or for every customer who takes its delivery. Thus, it is desired that in terms of working efficiency, the image placement error correction amount is calculated by the correction amount calculating section 7 and whether writing should be conducted is determined in advance.

Therefore, for example, a reader 16 for reading each of inherent identification marks provided in EUV mask blanks is provided outside the clean storage unit 15. Each identification mark read by the reader 16 is memorized in the mask back-surface shape data memory unit 8 in association with back-surface shape data. Further, a correction determination unit 71 for performing a correction based on the image placement correction amount according to the identification mark and determining whether writing should be conducted, may be provided in the correction amount calculating section 7. The identification mark may be, for example, a two-dimensional code (barcode, a QR code or the like) represented on each EUV blank. The reader 16 may be a known reader capable of reading these codes.

As a determining element of the correction determination unit 71, data about the attribute of a scanner using an EUV mask may be contained.

The features and advantages of the present invention may be summarized as follows.

As is apparent from the above description, each of the electron beam writing apparatus and the image placement error correcting method according to the present invention brings about advantageous effects in that since the shape of a pin chuck and the like are also taken into consideration where an EUV mask is held by the pin chuck, the accuracy of correction of an image placement error of each pattern can be enhanced and by extension, an improvement in the reliability of mask's basic quality can be attained because of a contribution to the improvement in the image placement accuracy. When a particle on an EUV mask exists between adjacent pins, for example, writing can be efficiently conducted without any problem in terms of accuracy even if it is out of spec in terms of the flatness.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-100951, filed on Apr. 9, 2008 including specification, claims, drawings and summary, on which the Convention priority of the present application is based, are incorporated herein by reference in its entirety.

What is claimed is:

1. An electron beam writing apparatus that corrects an image displacement error of an EUV mask based on a back surface shape of the EUV mask and a surface shape of an electrostatic pin chuck contacting the back surface of the EUV mask to hold the EUV mask on the electrostatic pin chuck, said electron beam writing apparatus comprising:
   a measuring unit that measures flatness of the back surface shape of the EUV mask held on the electrostatic pin chuck;
   a first storing unit that stores back surface shape data of the EUV mask measured by the measuring unit;

a second storing unit that stores surface shape data of the electrostatic pin chuck, comprising shape data of pins of the electrostatic pin chuck based on a relationship with center coordinates of the EUV mask, pitch data between the pins, and chucked region data;

a data extraction unit that extracts only a portion of the back surface shape data of the EUV mask using the surface shape data of the electrostatic pin chuck, the extracted portion of the back surface shape data of the EUV mask including only back surface shape data of the EUV mask at positions of the EUV mask that frictionally contact the pins of the electrostatic pin chuck;

a first calculating unit that approximates a shape of the EUV mask by a polynomial expression of only the extracted portion of the back surface shape data of the EUV mask extracted by the data extraction unit;

a tilt calculating unit that determines a local tilt distribution at back surface of the EUV mask from the polynomial expression that approximates the shape of the EUV mask using only the back surface shape data of the EUV mask at the positions of the EUV mask that frictionally contact the pins of the electrostatic chuck;

a second calculating unit that calculates an amount of image displacement error based on the determined local tilt distribution and a predetermined amount of distortion where the back surface of the EUV mask is held by the electrostatic pin chuck when a pattern is written onto a front surface of the EUV mask;

a coefficient calculating unit that obtains a coefficient, by computation of another polynomial expression that indicates an amount of deformation of the EUV mask surface when flat correction is performed on the EUV mask by holding the EUV mask with the electrostatic pin chuck while the EUV mask is used in a scanning process; and a third calculating unit that calculates a correction amount to correct the image displacement error of the EUV mask based on the calculated amount of image displacement error, by applying the coefficient.

2. The electron beam writing apparatus according to claim 1, wherein a neutral plane of the EUV mask, which determines the amount of the image displacement error, is of a distorted surface represented in a symmetric function system, taking a position where the back surface of the EUV mask and the surface of the electrostatic pin chuck initially contact, as center coordinates.

3. The electron beam writing apparatus according to claim 1, further comprising:
a reading unit that reads each of identification marks provided in EUV mask blanks,
wherein the first storing unit stores the identification marks and the back surface shape data therein in association with each other; and
a correction determination unit that performs determination as to whether writing is to be conducted, based on the correction amount of the amount of image displacement error when a corresponding identification mark is read by the reading unit.

4. The electron beam writing apparatus according to claim 3, wherein a neutral plane of the EUV mask, which determines the amount of the image displacement error, is of a distorted surface represented in a symmetric function system, taking a position where the back surface of the EUV mask and the surface of the electrostatic pin chuck initially contact, as center coordinates.

5. The electron beam writing apparatus according to claim 3, wherein the correction determination unit also uses data from a scanner using the EUV mask.

6. The electron beam writing apparatus according to claim 5, wherein a neutral plane of an EUV mask, which determines the amount of the image displacement error, is of a distorted surface represented in a symmetric function system, taking a position where the back surface of the EUV mask and the surface of the electrostatic pin chuck initially contact, as center coordinates.

7. A method for correcting an image displacement error of an EUV mask based on a back surface shape of the EUV mask and a surface shape of an electrostatic pin chuck contacting the back surface of the EUV mask to hold the EUV mask on the electrostatic pin chuck, said method comprising:
storing surface shape data of the electrostatic pin chuck, comprising shape data of pins of the pin chuck, pitch data between the pins, and chucked region data, in a second storing unit;
storing back surface shape data obtained by measuring flatness of the back surface shape of the EUV mask, in a first storing unit;
reading the back surface shape data of the EUV mask from the first storing unit, and the surface shape data of the electrostatic pin chuck from the second storing unit;
extracting, via a data extraction unit, only a portion of the back surface shape data of the EUV mask using the surface shape data of the electrostatic pin chuck, the extracted portions of the back surface shape data of the EUV mask including only back surface shape data of the EUV mask at positions of the EUV mask that frictionally contact the pins of the electrostatic pin chuck;
performing, in a first calculating unit, an approximate computing process that approximates a shape of the EUV mask by a polynomial expression of only the extracted portion of the back surface shape data of the EUV mask extracted by the extracting;
determining a local tilt distribution at a back surface of the EUV mask, in a tilt calculating unit, from the polynomial expression that approximates the shape of the EUV mask using only the back surface shape data of the EUV mask at the positions of the EUV mask that frictionally contact the pins of the electrostatic chuck;
calculating an amount of image displacement error in a second calculating unit, based on the determined local tilt distribution and a predetermined amount of distortion where the back surface of the EUV mask is held by the electrostatic pin chuck when a pattern is written onto a front surface of the EUV mask;
obtaining a coefficient in a coefficient calculating unit, by computation of another polynomial expression that indicates an amount of deformation of the EUV mask surface when flat correction is performed on the EUV mask by holding the EUV mask with the electrostatic pin chuck while the EUV mask is used in a scanning process; and
calculating a correction amount to correct the image displacement error of the EUV mask based on the calculated amount of image displacement error, by applying the coefficient, in a third calculating unit.

* * * * *